United States Patent
Wang

(10) Patent No.: US 8,470,129 B1
(45) Date of Patent: Jun. 25, 2013

(54) METHOD AND MACHINE FOR SEPARATING LIQUID CRYSTAL PANEL AND LINER PAD

(75) Inventor: Xingang Wang, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 13/516,720

(22) PCT Filed: May 8, 2012

(86) PCT No.: PCT/CN2012/075158
§ 371 (c)(1),
(2), (4) Date: Jun. 15, 2012

(51) Int. Cl.
*B32B 38/10* (2006.01)

(52) U.S. Cl.
USPC ........... 156/705; 156/707; 156/708; 156/714; 156/754; 156/757; 156/758; 156/764; 156/937; 156/924

(58) Field of Classification Search
None
See application file for complete search history.

(56) References Cited

U.S. PATENT DOCUMENTS

| | | | |
|---|---|---|---|
| 3,988,196 A * | 10/1976 | Wanesky | 156/541 |
| 4,264,405 A * | 4/1981 | Petrov et al. | 156/758 |
| 6,435,249 B1 * | 8/2002 | Komine et al. | 156/763 |
| 7,637,714 B2 * | 12/2009 | Kabeshita et al. | 414/806 |
| 2005/0082000 A1 * | 4/2005 | Moriya et al. | 156/345.28 |
| 2009/0032186 A1 * | 2/2009 | Cheung et al. | 156/344 |
| 2009/0218050 A1 * | 9/2009 | Nakamura et al. | 156/584 |
| 2010/0000680 A1 * | 1/2010 | Inao et al. | 156/344 |

* cited by examiner

*Primary Examiner* — Mark A Osele
*Assistant Examiner* — Nickolas Harm
(74) *Attorney, Agent, or Firm* — Cheng-Ju Chiang

(57) ABSTRACT

The present invention provides a method and machine for separating a liquid crystal panel and a liner pad. The method includes (1) providing a separation machine and a combination of the liquid crystal panel and liner pad to be separated, the separation machine including a separation device that includes a suction device, air blasting devices and shaking devices; (2) the suction device moving toward the combination; (3) a central suction nozzle first engaging and sucking a liner pad of the combination and later the first suction nozzles engaging the sucking the liner pad of the combination; (4) the shaking devices being operated to subject the combination to vibration and the air blasting devices being operated to eject air streams to side edges of the combination; and (5) the combination, after being subjected to vibration and air streams, being separated so as to realize separation of the liquid crystal panel and liner pad.

11 Claims, 3 Drawing Sheets

```
┌─────────────────────────────────────────────────────────────┐
│ providing a separation machine and a combination of liquid  │  1
│ crystal panel and liner pad to be separated, the separation │
│ machine comprising a control device, a position detection   │
│ device electrically connected to the control device, and a  │
│ separation device electrically connected to the control     │
│ device, the separation device comprising a suction device,  │
│ a plurality of air blasting devices, and a plurality of     │
│ shaking devices                                             │
└─────────────────────────────────────────────────────────────┘
                              │
┌─────────────────────────────────────────────────────────────┐
│ he control device controlling the suction device to move    │  2
│ toward the combination of liquid crystal panel and liner    │
│ pad to be separated and meanwhile, the position detection   │
│ device detecting, in a real time manner, a moving position  │
│ of the suction device and transmitting data of the detected │
│ moving position to the control device, the control device   │
│ controlling moving speed of the suction device according    │
│ to the data of moving position                              │
└─────────────────────────────────────────────────────────────┘
                              │
┌─────────────────────────────────────────────────────────────┐
│ the central suction nozzle first contacting and sucking the │  3
│ liner pad of the combination of liquid crystal panel and    │
│ liner pad to be separated, and subsequently the first       │
│ suction nozzles contacting and sucking the liner pad of the │
│ combination of liquid crystal panel and liner pad to be     │
│ separated                                                   │
└─────────────────────────────────────────────────────────────┘
                              │
┌─────────────────────────────────────────────────────────────┐
│ the control device controlling the shaking devices to shake │  4
│ in order to subject the combination of liquid crystal panel │
│ and liner pad to be separated to vibration and the control  │
│ device controlling the air blasting devices to eject air    │
│ streams to a side edge of the combination of liquid crystal │
│ panel and liner pad to be separated                         │
└─────────────────────────────────────────────────────────────┘
                              │
┌─────────────────────────────────────────────────────────────┐
│ after being subjected to vibration and air streams, the     │  5
│ liner pad of the combination of liquid crystal panel and    │
│ liner pad to be separated being separated from the liquid   │
│ crystal panel                                               │
└─────────────────────────────────────────────────────────────┘
```

Fig. 1

METHOD AND MACHINE FOR SEPARATING LIQUID CRYSTAL PANEL AND LINER PAD

BACKGROUND OF THE INVENTION

1. Field of the Invention

The present invention relates to the field of manufacture of liquid crystal displays, and in particular to a method and machine for separating a liquid crystal panel and a liner pad.

2. The Related Arts

The progress of modern technology brings new displaying techniques. Considering the large scale of mass production, the liquid crystal display devices are now the main stream of flat display devices. Recently, most of the mobile phones, notebook computers, and digital cameras adopt a liquid crystal display device as a display screen thereof.

In the current TFT-LCD (Thin-Film Transistor Liquid Crystal Display) industry, after being manufactured, liquid crystal panels are subjected to inspection and classification according to quality thereof. Afterwards, the liquid crystal panels and liner pads are sequentially positioned in a package box in a spaced manner. With the generation of panel getting higher and higher, the weight of the liquid crystal panel is increased. The liner pad, which is subjected to a pressing force of the liquid crystal panel, may undergo deformation, causing air contained in recessed channels of the liner pad to be expelled out and the liner pad sticking to the liquid crystal panel. Certain vacuum is thus formed between the liquid crystal panel and the liner pad. The combination of the liquid crystal panel and the liner pad so formed is hard to break up, causing troubles to the subsequent module process and customers.

SUMMARY OF THE INVENTION

An object of the present invention is to provide a method for separating a liquid crystal panel and a liner pad, which efficiently separates the stuck liquid crystal panel and liner pad without causing damage to the liquid crystal panel during the separation process and shortens the time period required for the separation thereby lowering the manufacture cost.

The present invention also provides a separation machine, which is used to separate a liquid crystal panel and a liner pad and has a simple structure and is easy to operate.

To achieve the objects, the present invention provides a method for separating a liquid crystal panel and a liner pad, which comprises the following steps:

(1) providing a separation machine and a combination of liquid crystal panel and liner pad to be separated, the separation machine comprising a control device, a position detection device electrically connected to the control device, and a separation device electrically connected to the control device, the separation device comprising a suction device, a plurality of air blasting devices, and a plurality of shaking devices, the suction device comprising a first suction unit, the first suction unit comprising a first connection bar, a central suction arm mounted to a center of the first connection bar, a plurality of first suction arms mounted to the first connection bar and respectively located at outsides of the central suction arm, and a central suction nozzle and first suction nozzles respectively mounted to free ends of the central suction arm and the first suction arms, the central suction nozzle and the first suction nozzles being arranged to face downward with respect to a horizontal direction, the central suction nozzle being set at a level lower than that of the first suction nozzles;

(2) the control device controlling the suction device to move toward the combination of the liquid crystal panel and the liner pad to be separated and meanwhile, the position detection device detecting, in a real time manner, a moving position of the suction device and transmitting data of the detected moving position to the control device, the control device controlling moving speed of the suction device according to the data of moving position;

(3) the central suction nozzle first contacting and sucking the liner pad of the combination of the liquid crystal panel and liner pad to be separated, and subsequently the first suction nozzles contacting and sucking the liner pad of the combination of the liquid crystal panel and liner pad to be separated;

(4) the control device controlling the shaking devices to shake in order to subject the combination of the liquid crystal panel and liner pad to be separated to vibration and the control device controlling the air blasting devices to eject air streams to a side edge of the combination of the liquid crystal panel and liner pad to be separated; and (5) after being subjected to vibration and air streams, the liner pad of the combination of the liquid crystal panel and liner pad to be separated being separated from the liquid crystal panel.

The suction device further comprises second and third suction units. The first, second, and third suction units are arranged, in sequence, from inside to outside. The second suction unit comprises a second connection bar, a plurality of second suction arms mounted to the second connection bar, and second suction nozzles respectively mounted to free ends of the second suction arms. The third suction unit comprises a third connection bar, a plurality of third suction arms mounted to the third connection bar, and third suction nozzles respectively mounted to free ends of the third suction arm. The second suction nozzles and the third suction nozzles are arranged to face downward with respect to the horizontal direction. The second suction nozzles are set at a level corresponding to that of the central suction nozzle. The third suction nozzles are set at a level corresponding to that of the first suction nozzles.

Each of the air blasting devices comprises a connection arm, an electric machine mounted to the connection arm, and an air cutter mounted to the electric machine. The air cutter forms a flat air ejection outlet. The electric machine is electrically connected to the control device, whereby the electric machine, when put in operation, drives the air cutter to oscillate, and the connection arm is mounted to an end of the third connection bar. The shaking devices comprise shaking servos, which are respectively mounted to the first, second, third suction arms and are electrically connected to the control device.

The suction device, in a process of moving toward the combination of the liquid crystal panel and liner pad to be separated, is subjected to two times of decelerations, of the a first time deceleration reduces moving speed to 30% of initial speed and a second time deceleration reduces the moving speed to 15% of the initial speed.

The suction device comprises first, second, and third cylinders that are respectively coupled to the first, second, and third suction units. The control device individually controls the first, second, and third cylinders to operate in order to control movements of the first, second, and third suction units.

The first cylinder is coupled between the first and second connection bars. The second cylinder is coupled between the second and third connection bars. The third cylinder is coupled to the third connection bar. The control device controls the first cylinder to move the first suction unit, the control device controlling the second cylinder to simultaneously move the first and second suction units, the control device controlling the third cylinder to move the first, second, and third suction units.

The present invention also provides a separation machine, which comprises a control device, a position detection device electrically connected to the control device, and a separation device electrically connected to the control device. The separation device comprises a suction device, a plurality of air blasting devices mounted to the suction device, and a plurality of shaking devices mounted to the suction device. The suction device comprises a first suction unit, and the first suction unit comprises a first connection bar, a central suction arm mounted to a center of the first connection bar, a plurality of first suction arms mounted to the first connection bar and respectively located at outsides of the central suction arm. A central suction nozzle and the first suction nozzles respectively mounted to free ends of the central suction arm and the first suction arms. The central suction nozzle and the first suction nozzles are arranged to face downward with respect to a horizontal direction, the central suction nozzle being set at a level lower than that of the first suction nozzles.

The suction device further comprises second and third suction units. The first, second, and third suction units are arranged, in sequence, from inside to outside. The second suction unit comprises a second connection bar, a plurality of second suction arms mounted to the second connection bar, and second suction nozzles respectively mounted to free ends of the second suction arms. The third suction unit comprises a third connection bar, a plurality of third suction arms mounted to the third connection bar, and third suction nozzles respectively mounted to free ends of the third suction arm. The second suction nozzles and the third suction nozzles are arranged to face downward with respect to the horizontal direction. The second suction nozzles are set at a level corresponding to that of the central suction nozzle. The third suction nozzles are set at a level corresponding to that of the first suction nozzles.

Each of the air blasting devices comprises a connection arm, an electric machine mounted to the connection arm, and an air cutter mounted to the electric machine. The air cutter forms a flat air ejection outlet. The electric machine is electrically connected to the control device, whereby the electric machine, when put in operation, drives the air cutter to oscillate. The connection arm is mounted to an end of the first connection bar. The shaking devices comprise shaking servos, which are respectively mounted to the first, second, third suction arms and are electrically connected to the control device.

The suction device comprises first, second, and third cylinders that are respectively coupled to the first, second, and third suction units. The control device individually controls the first, second, and third cylinders to operate in order to control movements of the first, second, and third suction units. The first cylinder is coupled between the first and second connection bars. The second cylinder is coupled between the second and third connection bars. The third cylinder is coupled to the third connection bar, and the control device controls the first cylinder to move the first suction unit. The control device controls the second cylinder to simultaneously move the first and second suction units. The control device controls the third cylinder to move the first, second, and third suction units.

The efficacy of the present invention is that the present invention provides a method for separating a liquid crystal panel and liner pad, which uses suction nozzles that are mounted to a suction device at different levels to break vacuum between the liquid crystal panel and the liner pad and comprises shaking servos mounted to suction arms and further uses air cutters to supply air streams so as to have the liquid crystal panel and the liner pad separated without pulling and stretching the liquid crystal panel and the liner pad so as to avoid undesired substrate entraining or breaking. The present invention also provides a separation machine, which realizes separation of liquid crystal panel and liner pad through a simple structure, avoids damage caused on the liquid crystal panel, shortens the time period required for separation, and thereby reduces the manufacture cost.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, will be apparent from the following detailed description of embodiments of the present invention, with reference to the attached drawings. In the drawings:

FIG. 1 is a flow chart illustrating a method for separating a liquid crystal panel and a liner pad according to the present invention;

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Referring to FIG. 1, the present invention provides a method for separating a liquid crystal panel and a liner pad, which comprises the following steps:

Step 1: providing a separation machine and a combination of the liquid crystal panel and liner pad to be separated, the separation machine comprising a control device, a position detection device electrically connected to the control device, and a separation device electrically connected to the control device, the separation device comprising a suction device, a plurality of air blasting devices, and a plurality of shaking devices, the suction device comprising a first suction unit, the first suction unit comprising a first connection bar, a central suction arm mounted to a center of the first connection bar, a plurality of first suction arms mounted to the first connection bar and respectively located at outsides of the central suction arm, and a central suction nozzle and first suction nozzles respectively mounted to free ends of the central suction arm and the first suction arms, the central suction nozzle and the first suction nozzles being arranged to face downward with respect to a horizontal direction, the central suction nozzle being set at a level lower than that of the first suction nozzles;

Step 2: the control device controlling the suction device to move toward the combination of the liquid crystal panel and liner pad to be separated and meanwhile, the position detection device detecting, in a real time manner, a moving position of the suction device and transmitting data of the detected moving position to the control device, the control device controlling moving speed of the suction device according to the data of moving position;

Step 3: the central suction nozzle first contacting and sucking the liner pad of the combination of the liquid crystal panel and liner pad to be separated, and subsequently the first suction nozzles contacting and sucking the liner pad of the combination of the liquid crystal panel and liner pad to be separated;

Step 4: the control device controlling the shaking devices to shake in order to subject the combination of the liquid crystal panel and liner pad to be separated to vibration and the control device controlling the air blasting devices to eject air streams to a side edge of the combination of the liquid crystal panel and liner pad to be separated; and Step 5: after being subjected to vibration and air streams, the liner pad of the combination of a liquid crystal panel and a liner pad to be separated being separated from the liquid crystal panel.

Figure 2:
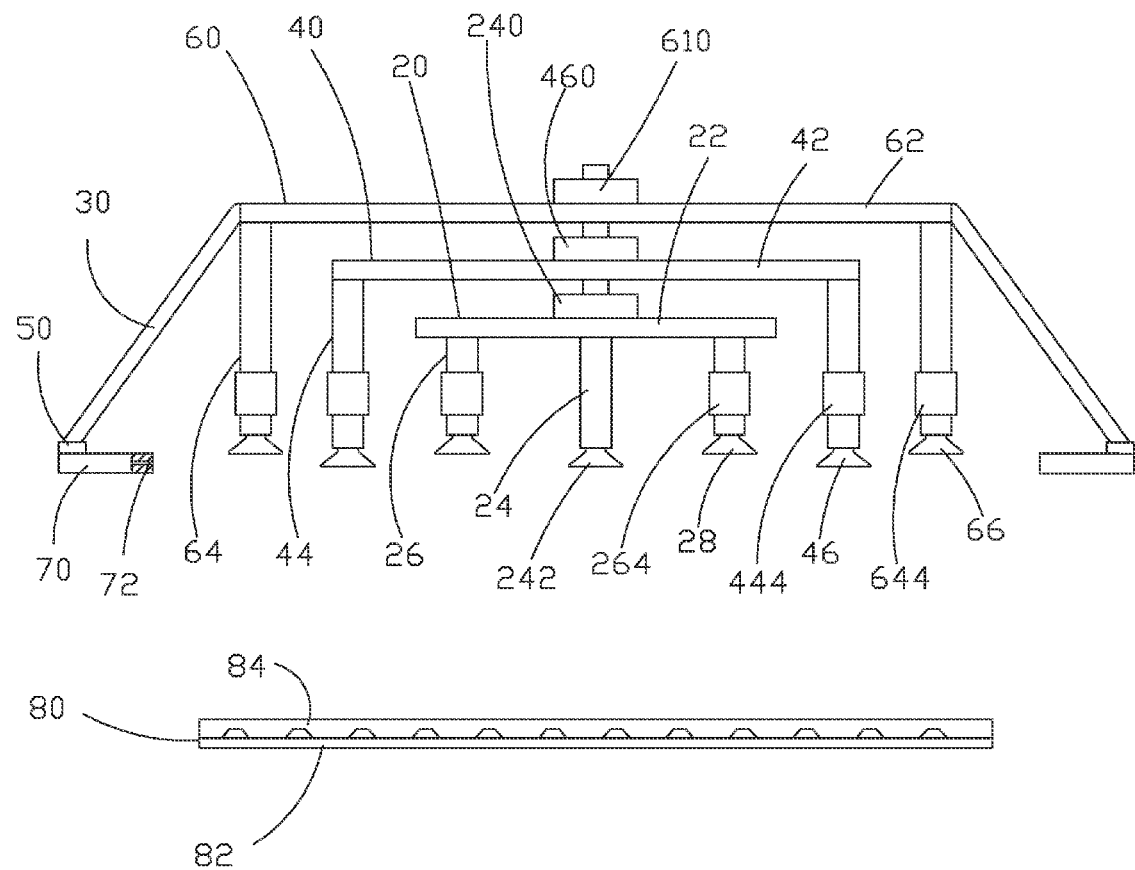
FIG. 2 is a schematic view showing a separation machine according to the present invention and a combination of a liquid crystal panel and a liner pad to be separated.

Also referring to FIG. 2, preferably, in Step 1, the suction device comprises first, second, and third suction units 20, 40, 60, which are arranged in sequence from inside to outside. The first suction unit 20 comprises a first connection bar 22, a central suction arm 24 mounted to a center of the first connection bar 22, a plurality of first suction arms 26 mounted to the first connection bar 22 and respectively located at outsides of the central suction arm 24, and a central suction nozzle 242 and first suction nozzles 28 respectively mounted to free ends of the central suction arm 24 and the first suction arms 26. The second suction unit 40 comprises a second connection bar 42, a plurality of second suction arms 44 mounted to the second connection bar 42, and second suction nozzles 46 respectively mounted to free ends of the second suction arms 44. The third suction unit 60 comprises a third connection bar 62, a plurality of third suction arms 64 mounted to the third connection bar 62, and third suction nozzles 66 respectively mounted to free ends of the third suction arms 64. The central suction nozzle 242 and the first suction nozzles 28 are arranged to face downward with respect to a horizontal direction and the central suction nozzle 242 is set at a level lower than that of the first suction nozzles 28. The second suction nozzles 46 and the third suction nozzles 66 are arranged to face downward with respect to the horizontal direction. The second suction nozzles 46 are set at a level corresponding to that of the central suction nozzle 242. The third suction nozzles 66 are set at a level corresponding to that of the first suction nozzles 28. Thus, the central suction nozzle 242 and the first, second, and third suction nozzles 28, 46, 66 are arranged in a wavy form in a vertical plane to help breaking vacuum between the liquid crystal panel 82 and the liner pad 84.

The position detection device (not shown) is mounted to the suction device. In the instant embodiment, the position detection device is mounted to the first connection bar 22 of the first suction unit 20.

Each of the air blasting devices comprises a connection arm 30, an electric machine 50 mounted to the connection arm 30, and an air cutter 70 mounted to the electric machine 50. The air cutter 70 forms a flat air ejection outlet 72. The electric machine 50 is electrically connected to the control device. When put in operation, the electric machine 50 drives the air cutter 70 to oscillate. The connection arm 30 is mounted to an end of the third connection bar 62.

The combination of the liquid crystal panel and liner pad to be separated 80 comprises a liquid crystal panel 82 and a liner pad 84 attached to the liquid crystal panel 82.

Figure 3:
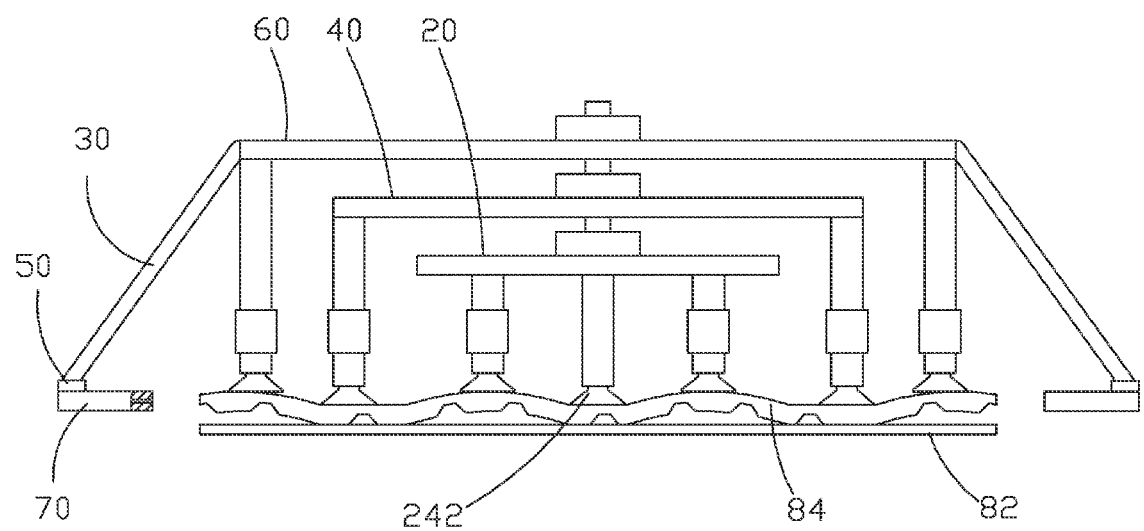
FIG. 3 is a schematic view showing the separation machine according to the present invention sucking the combination of a liquid crystal panel and a liner pad to be separated.

Also referring to FIG. 3, in Step 2, the suction device further comprises first, second, and third cylinders 240, 460, 610 that are respectively coupled to the first, second, and third suction units 20, 40, 60. The control device individually controls the first, second, and third cylinders 240, 460, 610 to operate in order to control movements of the first, second, and third suction units 20, 40, 60.

The first cylinder 240 is coupled between the first and second connection bars 22, 42. The second cylinder 460 is coupled between the second and third connection bars 42, 62. The third cylinder 610 is coupled to the third connection bar 62. The control device controls the first cylinder 240 to move the first suction unit 20; the control device controls the second cylinder 460 to simultaneously move the first and second suction units 20, 40; and the control device controls the third cylinder 610 to move the first, second, and third suction units 20, 40, 60. The first, second, and third suction units 20, 40, 60 are arranged, in sequence, from inside to outside, so that lengths of the first, second, and third connection bars 22, 42, 62 are sequentially increased. Based on the size of liquid crystal panel 82, the control device controls the first, second, and third suction units 20, 40, 60 in such a way that one, two, or all three of these suction units are selectively put into operation. For example, when the liquid crystal panel 82 is of a size of 26-32 inches, the control device carries out control in such a way that only the first suction unit 20 is put into operation for suction. When the liquid crystal panel 82 is of a size of 35-46 inches, the control device carries out control in such a way that both the first and second suction units 20, 40 are set in operation simultaneously for suction. And, when the liquid crystal panel 82 is of a size greater than 55 inches, the control device carries out the control in such a way that the first, second, and third suction units 20, 40, 60 are set in operation simultaneously for suction.

In this step, the position detection device detects, in a real-time manner, a moving position of the suction device and transmits the data of the detected moving position to the control device. Two predetermined positions are set above the combination of the liquid crystal panel and liner pad to be separated 80 and they are respectively referred to as a first predetermined position and a second predetermined position. The first predetermined position is located higher than the second predetermined position. Thus, the second predetermined position is closer to the combination of the liquid crystal panel and liner pad to be separated 80 than the first predetermined position is. When the suction device reaches the first predetermined position, the control device controls the suction device to take a first time deceleration; and when the suction device reaches the second predetermined position, the control device controls the suction device to take a second time deceleration. In the instant embodiment, the first time deceleration reduces the speed of the suction device to approximately 30% of initial speed and the second time deceleration reduces the speed to around 15% of the initial speed. In other words, the speed of the suction device, from start of moving to the decelerated condition, is sequentially 100%, 30%, and 15% of the initial speed, and this helps preventing the force applied by the suction device from more tightly compacting the combination of the liquid crystal panel and the liner pad to be separated.

In Step 3, taking a liquid crystal panel 82 of 26-32 inches as an example, only the first suction unit 20 is operated for suction. To carry out suction, the central suction nozzle 242 first engages and sucks the liner pad 84, while the first suction unit 20 is continuously moving downwards to allow the first suction nozzles 28 to engage and suck the liner pad 84. During such a process, the liner pad 84 undergoes deformation, which breaks the vacuum between the liner pad 84 and the liquid crystal panel 82, thereby making separation of the liner pad 84 and the liquid crystal panel 82 easier.

In Step 4, the shaking devices comprise shaking servos 264, 444, 644, which are respectively mounted to the first, second, third suction arms 26, 44, 64 and are electrically connected to the control device. The control device controls the shaking devices to shake so as to subject the combination of the liquid crystal panel and liner pad to be separated 80 to vibration. Further, the control device controls the electric machines 50 to cause the air cutters 70 to rotate, whereby air streams are supplied towards side edges of the combination of the liquid crystal panel and liner pad to be separated 80 through the air ejection outlets 72 of the air cutters 70 so as to further break the vacuum condition between the liquid crystal panel 82 and the liner pad 84.

Figure 4:
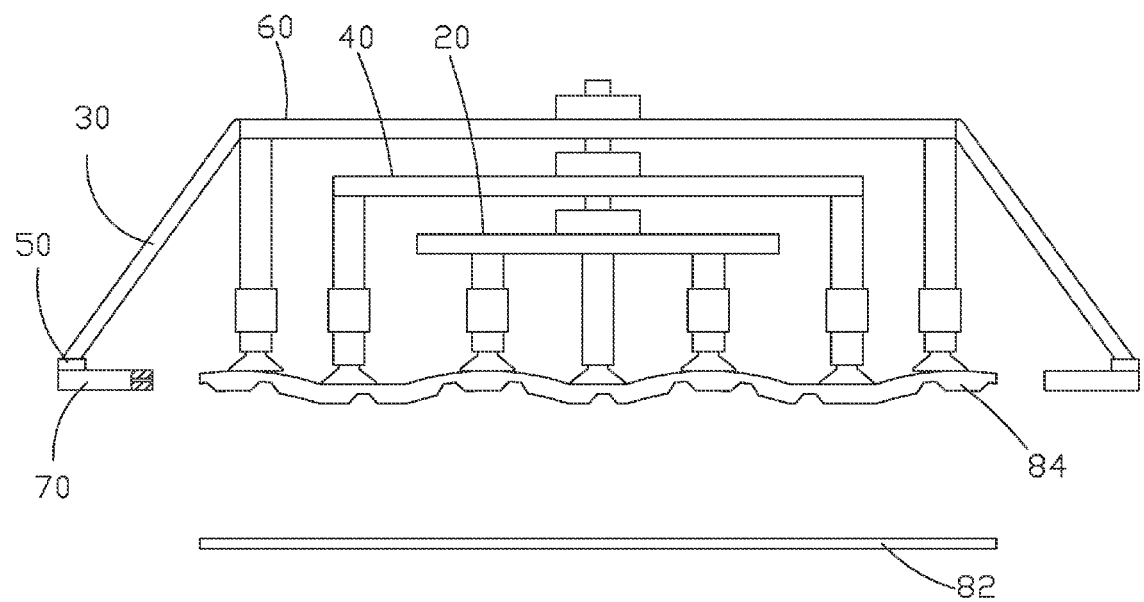
FIG. 4 is a schematic view showing the separation machine according to the present invention separating the combination of a liquid crystal panel and a liner pad to be separated.

Also referring to FIG. 4, in Step 5, the liner pad 84 of the combination of the liquid crystal panel and liner pad to be separated 80, after having been subjected to vibration and air streams, is separated from the liquid crystal panel 82. Referring to FIGS. 2-4, the present invention also provides a separation machine, which comprises a control device (not shown), a position detection device (not shown) electrically connected to the control device, and a separation device electrically connected to the control device. The separation device comprises a suction device, a plurality of air blasting devices, and a plurality of shaking devices.

The suction device comprises, in sequence from inside to outside, first, second, and third suction units 20, 40, 60. The first suction unit 20 comprises a first connection bar 22, a central suction arm 24 mounted to a center of the first connection bar 22, a plurality of first suction arms 26 mounted to the first connection bar 22 and respectively located at outsides of the central suction arm 24, and a central suction nozzle 242 and first suction nozzles 28 respectively mounted to free ends of the central suction arm 24 and the first suction arms 26. The second suction unit 40 comprises a second connection bar 42, a plurality of second suction arms 44 mounted to the second connection bar 42, and second suction nozzles 46 respectively mounted to free ends of the second suction arms 44. The third suction unit 60 comprises a third connection bar 62, a plurality of third suction arms 64 mounted to the third connection bar 62, and third suction nozzles 66 respectively mounted to free ends of the third suction arms 64. The central suction nozzle 242 and the first suction nozzles 28 are arranged to face downward with respect to a horizontal direction and the central suction nozzle 242 is set at a level lower than that of the first suction nozzles 28. The second suction nozzles 46 and the third suction nozzles 66 are arranged to face downward with respect to the horizontal direction. The second suction nozzles 46 are set at a level corresponding to that of the central suction nozzle 242. The third suction nozzles 66 are set at a level corresponding to that of the first suction nozzles 28. Thus, the central suction nozzle 242 and the first, second, and third suction nozzles 28, 46, 66 are arranged in a wavy form in a vertical plane so as to make sequential engagement with the combination of the liquid crystal panel and liner pad to be separated 80. When the suction device sucks the combination of the liquid crystal panel and liner pad to be separated 80, the central suction nozzle 242 first engages and sucks the liner pad 84, while the first suction unit 20 is continuously moving downwards to allow the first suction nozzles 28 to engage and suck the liner pad 84. During such a process, the liner pad 84 undergoes deformation, which breaks the vacuum between the liner pad 84 and the liquid crystal panel 82, thereby making separation of the liner pad 84 and the liquid crystal panel 82 easier.

The position detection device (not shown) is mounted to the suction device. In the instant embodiment, the position detection device is mounted to the first connection bar 22 of the first suction unit 20. The position detection device detects, in a real-time manner, a moving position of the suction device and transmits data of the detected moving position to the control device. The control device controls the moving speed of the suction device according to the data of moving position. Two predetermined positions are set above the combination of the liquid crystal panel and liner pad to be separated 80 and they are respectively referred to as a first predetermined position and a second predetermined position. The first predetermined position is located higher than the second predetermined position. Thus, the second predetermined position is closer to the combination of the liquid crystal panel and liner pad to be separated 80 than the first predetermined position is. When the suction device reaches the first predetermined position, the control device controls the suction device to take a first time deceleration; and when the suction device reaches the second predetermined position, the control device controls the suction device to take a second time deceleration. In the instant embodiment, the first time deceleration reduces the speed of the suction device to approximately 30% of initial speed and the second time deceleration reduces the speed to around 15% of the initial speed. In other words, the speed of the suction device, from start of moving to the decelerated condition, is sequentially 100%, 30%, and 15% of the initial speed, and this helps preventing the force applied by the suction device from more tightly compacting the combination of the liquid crystal panel and the liner pad to be separated.

Each of the air blasting devices comprises a connection arm 30, an electric machine 50 mounted to the connection arm 30, and an air cutter 70 mounted to the electric machine 50. The air cutter 70 forms a flat air ejection outlet 72. The electric machine 50 is electrically connected to the control device. When put in operation, the electric machine 50 drives the air cutter 70 to oscillate. The connection arm 30 is mounted to an end of the third connection bar 62.

The suction device further comprises first, second, and third cylinders 240, 460, 610 that are respectively coupled to the first, second, and third suction units 20, 40, 60. The control device individually controls the first, second, and third cylinders 240, 460, 610 to operate in order to control movements of the first, second, and third suction units 20, 40, 60.

The first cylinder 240 is coupled between the first and second connection bars 22, 42. The second cylinder 460 is coupled to the second and third connection bars 42, 62. The third cylinder 610 is coupled to the third connection bar 62. The control device controls the first cylinder 240 to move the first suction unit 20; the control device controls the second cylinder 460 to simultaneously move the first and second suction units 20, 40; and the control device controls the third cylinder 610 to move the first, second, and third suction units 20, 40, 60. The first, second, and third suction units 20, 40, 60 are arranged, in sequence, from inside to outside, so that lengths of the first, second, and third connection bars 22, 42, 62 are sequentially increased.

The shaking devices comprise shaking servos 264, 444, 644, which are respectively mounted to the first, second, third suction arms 26, 44, 64 and are electrically connected to the control device. The shaking servos 264, 444, 644, when shaking, cause the first, second, and third suction arms 26, 44, 64 and the first, second, and third suction nozzles 28, 46, 66 to shake thereby making the combination of the liquid crystal panel and liner pad to be separated 80 that is sucked by the first, second, and third suction nozzles 28, 46, 66 to vibrate. Further, air streams are supplied towards side edges of the combination of the liquid crystal panel and liner pad to be separated 80 through the air ejection outlets 72 of the air cutters 70 so as to further break the vacuum condition between the liquid crystal panel 82 and the liner pad 84 to make them separated.

In summary, the present invention provides a method for separating the liquid crystal panel and liner pad, which uses suction nozzles that are mounted to a suction device at different levels to break vacuum between the liquid crystal panel and the liner pad and comprises shaking servos mounted to suction arms and further uses air cutters to supply air streams so as to have the liquid crystal panel and the liner pad separated without pulling and stretching the liquid crystal panel and the liner pad so as to avoid undesired substrate entraining or breaking. The present invention also provides a separation machine, which realizes separation of liquid crystal panel and liner pad through a simple structure, avoids damage caused on the liquid crystal panel, shortens the time period required for separation, and thereby reduces the manufacture cost.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for separating a liquid crystal panel and a liner pad, comprising the following steps:
   (1) providing a separation machine and a combination of the liquid crystal panel and liner pad to be separated, the separation machine comprising a control device, a position detection device electrically connected to the control device, and a separation device electrically connected to the control device, the separation device comprising a suction device, a plurality of air blasting devices, and a plurality of shaking devices, the suction device comprising a first suction unit, the first suction unit comprising a first connection bar, a central suction arm mounted to a center of the first connection bar and having a free end that extends away from the first connection bar, a plurality of first suction arms mounted to the first connection bar on both sides of the central suction arm and each having a free end that extends away from the first connection bar, and a central suction nozzle and first suction nozzles respectively mounted to the free ends of the central suction arm and the first suction arms, the central suction nozzle and the first suction nozzles being arranged to face downward, the central suction nozzle being set at a height lower than that of the first suction nozzles;
   (2) the control device controlling the suction device to move toward the combination of the liquid crystal panel and liner pad to be separated and meanwhile, the position detection device detecting, in a real time manner, a moving position of the suction device and transmitting data of the detected moving position to the control device, the control device controlling moving speed of the suction device according to the data of moving position;
   (3) the central suction nozzle first contacting and sucking the liner pad of the combination of the liquid crystal panel and liner pad to be separated, and subsequently the first suction nozzles contacting and sucking the liner pad of the combination of the liquid crystal panel and liner pad to be separated;
   (4) the control device controlling the shaking devices to shake in order to subject the combination of the liquid crystal panel and liner pad to be separated to vibration and the control device controlling the air blasting devices to eject air streams to a side edge of the combination of the liquid crystal panel and liner pad to be separated; and
   (5) after being subjected to vibration and air streams, the liner pad of the combination of the liquid crystal panel and liner pad to be separated being separated from the liquid crystal panel.

2. The method for separating a liquid crystal panel and a liner pad as claimed in claim 1, wherein the suction device further comprises second and third suction units, the second suction unit comprising a second connection bar, a plurality of second suction arms mounted to the second connection bar in such a way that the second suction arms are located outside the first suction unit and each has a free end that extends away from the second connection bar, and second suction nozzles respectively mounted to the free ends of the second suction arms, the third suction unit comprising a third connection bar, a plurality of third suction arms mounted to the third connection bar in such a way that the third suction arms are located outside the second suction unit and each has a free end that extends away from the third connection bar, and third suction nozzles respectively mounted to the free ends of the third suction arms, the second suction nozzles and the third suction nozzles being arranged to face downward, the second suction nozzles being set at a height corresponding to that of the central suction nozzle, the third suction nozzles being set at a height corresponding to that of the first suction nozzles.

3. The method for separating a liquid crystal panel and a liner pad as claimed in claim 2, wherein each of the air blasting devices comprises a connection arm, an electric machine mounted to the connection arm, and an air cutter mounted to the electric machine, the air cutter comprising a flat air ejection outlet, the electric machine being electrically connected to the control device, whereby the electric machine, when put in operation, drives the air cutter to oscillate, the connection arm being mounted to an end of the third connection bar, the shaking devices comprising shaking servos, which are mounted to the first, second, third suction arms and are electrically connected to the control device.

4. The method for separating a liquid crystal panel and a liner pad as claimed in claim 2, wherein the suction device decelerates to 30% of its initial speed and then decelerates to 15% of its initial speed when the control device moves the suction device toward the combination of the liquid crystal panel and liner pad to be separated.

5. The method for separating a liquid crystal panel and a liner pad as claimed in claim 2, wherein the suction device comprises first, second, and third cylinders that are respectively coupled to the first, second, and third suction units, the control device individually controlling the first, second, and third cylinders to operate in order to control movements of the first, second, and third suction units.

6. The method for separating a liquid crystal panel and a liner pad as claimed in claim 5, wherein the first cylinder is arranged between the first and second connection bars and coupled to the first connection bar, the second cylinder being arranged between the second and third connection bars and coupled to the second connection bar, the third cylinder being coupled to the third connection bar, the control device controlling the first cylinder to move the first suction unit, the control device controlling the second cylinder to simultaneously move the first and second suction units, the control device controlling the third cylinder to move the first, second, and third suction units.

7. A separation machine, comprising a control device, a position detection device electrically connected to the control device, and a separation device electrically connected to the control device, the separation device comprising a suction device, a plurality of air blasting devices mounted to the suction device, and a plurality of shaking devices mounted to the suction device, the suction device comprising a first suction unit, the first suction unit comprising a first connection bar, a central suction arm mounted to a center of the first connection bar and having a free end that extends away from the first connection bar, a plurality of first suction arms mounted to the first connection bar on both sides of the central suction arm and each having a free end that extends away from the first connection bar, and a central suction nozzle and first suction nozzles respectively mounted to the free ends of the central suction arm and the first suction arms, the central suction nozzle and the first suction nozzles being arranged to face downward, the central suction nozzle being set at a height lower than that of the first suction nozzles.

8. The separation machine as claimed in claim 7, wherein the suction device further comprises second and third suction units, the second suction unit comprising a second connection bar, a plurality of second suction arms mounted to the second connection bar in such a way that the second suction arms are located outside the first suction unit and each has a free end that extends away from the second connection bar, and second suction nozzles respectively mounted to the free ends of the second suction arms, the third suction unit comprising a third connection bar, a plurality of third suction arms mounted to the third connection bar in such a way that the third suction arms are located outside the second suction unit and each has a free end that extends away from the third connection bar, and third suction nozzles respectively mounted to the free ends of the third suction arms, the second suction nozzles and the third suction nozzles being arranged to face downward, the second suction nozzles being set at a height corresponding to that of the central suction nozzle, the third suction nozzles being set at a height corresponding to that of the first suction nozzles.

9. The separation machine as claimed in claim 8, wherein each of the air blasting devices comprises a connection arm, an electric machine mounted to the connection arm, and an air cutter mounted to the electric machine, the air cutter comprising a flat air ejection outlet, the electric machine being electrically connected to the control device, whereby the electric machine, when put in operation, drives the air cutter to oscillate, the connection arm being mounted to an end of the first connection bar, the shaking devices comprising shaking servos, which are mounted to the first, second, third suction arms and are electrically connected to the control device.

10. The separation machine as claimed in claim 8, wherein the suction device comprises first, second, and third cylinders that are respectively coupled to the first, second, and third suction units, the control device individually controlling the first, second, and third cylinders to operate in order to control movements of the first, second, and third suction units, the first cylinder being arranged between the first and second connection bars and coupled to the first connection bar, the second cylinder being arranged between the second and third connection bars and coupled to the second connection bar, the third cylinder being coupled to the third connection bar, the control device controlling the first cylinder to move the first suction unit, the control device controlling the second cylinder to simultaneously move the first and second suction units, the control device controlling the third cylinder to move the first, second, and third suction units.

11. A separation machine, comprising a control device, a position detection device electrically connected to the control device, and a separation device electrically connected to the control device, the separation device comprising a suction device, a plurality of air blasting devices mounted to the suction device, and a plurality of shaking devices mounted to the suction device, the suction device comprising a first suction unit, the first suction unit comprising a first connection bar, a central suction arm mounted to a center of the first connection bar and having a free end that extends away from the first connection bar, a plurality of first suction arms mounted to the first connection bar on both sides of the central suction arm and each having a free end that extends away from the first connection bar, and a central suction nozzle and first suction nozzles respectively mounted to the free ends of the central suction arm and the first suction arms, the central suction nozzle and the first suction nozzles being arranged to face downward, the central suction nozzle being set at a height lower than that of the first suction nozzles;

wherein the suction device further comprises second and third suction units, the second suction unit comprising a second connection bar, a plurality of second suction arms mounted to the second connection bar in such a way that the second suction arms are located outside the first suction unit and each has a free end that extends away from the second connection bar, and second suction nozzles respectively mounted to the free ends of the second suction arms, the third suction unit comprising a third connection bar, a plurality of third suction arms mounted to the third connection bar in such a way that the third suction arms are located outside the second suction unit and each has a free end that extends away from the third connection bar, and third suction nozzles respectively mounted to the free ends of the third suction arms, the second suction nozzles and the third suction nozzles being arranged to face downward, the second suction nozzles being set at a height corresponding to that of the central suction nozzle, the third suction nozzles being set at a height corresponding to that of the first suction nozzles;

wherein each of the air blasting devices comprises a connection arm, an electric machine mounted to the connection arm, and an air cutter mounted to the electric machine, the air cutter comprising a flat air ejection outlet, the electric machine being electrically connected to the control device, whereby the electric machine, when put in operation, drives the air cutter to oscillate, the connection arm being mounted to an end of the first connection bar, the shaking devices comprising shaking servos, which are mounted to the first, second, third suction arms and are electrically connected to the control device; and wherein the suction device comprises first, second, and third cylinders that are respectively coupled to the first, second, and third suction units, the control device individually controlling the first, second, and third cylinders to operate in order to control movements of the first, second, and third suction units, the first cylinder being arranged between the first and second connection bars and coupled to the first connection bar, the second cylinder being arranged between the second and third connection bars and coupled to the second connection bar, the third cylinder being coupled to the third connection bar, the control device controlling the first cylinder to move the first suction unit, the control device controlling the second cylinder to simultaneously move the first and second suction units, the control device controlling the third cylinder to move the first, second, and third suction units.

* * * * *